United States Patent
Hu et al.

(10) Patent No.: US 7,823,241 B2
(45) Date of Patent: Nov. 2, 2010

(54) SYSTEM FOR CLEANING A WAFER

(75) Inventors: Tien-Chen Hu, Pingtung (TW);
Chih-Ming Hsieh, Tainan (TW);
Chien-Chang Lai, Nantou (TW);
Wen-Jin Lee, Tainan (TW); Da-Hsiang Chen, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 870 days.

(21) Appl. No.: 11/723,900

(22) Filed: Mar. 22, 2007

(65) Prior Publication Data

US 2008/0229526 A1 Sep. 25, 2008

(51) Int. Cl.
*B08B 11/00* (2006.01)

(52) U.S. Cl. .............................. 15/77; 15/88.2; 15/102

(58) Field of Classification Search .............. 15/77, 15/88.2, 102
See application file for complete search history.

(56) References Cited

U.S. PATENT DOCUMENTS

| 5,966,765 | A | * | 10/1999 | Hamada et al. ............... 15/77 |
| 6,550,091 | B1 | | 4/2003 | Radman et al. |
| 6,594,847 | B1 | | 7/2003 | Krusell et al. |
| 6,622,334 | B1 | * | 9/2003 | Ziemins et al. ............... 15/77 |
| 6,851,152 | B2 | * | 2/2005 | Sotozaki et al. ............. 15/88.3 |
| 2002/0029431 | A1 | * | 3/2002 | Oikawa et al. ................ 15/77 |

FOREIGN PATENT DOCUMENTS

WO WO-2006/116263 A1 11/2006

\* cited by examiner

*Primary Examiner*—Randall Chin
(74) *Attorney, Agent, or Firm*—Birch, Stewart, Kolasch & Birch, LLP

(57) ABSTRACT

A system for cleaning a wafer. At least one first chuck roller is connected to a first roller base and includes a first annular groove. A second roller base opposes the first roller base. At least one second chuck roller is connected to the second roller base and includes a second annular groove. A sensing chuck roller is connected to the second roller base and includes a third annular groove corresponding to the first and second annular grooves. A cleaning member covers the third annular groove. A circumferential edge of the wafer is positioned in the first and second annular grooves and abuts the cleaning member. The first and second chuck rollers rotate the wafer, enabling the circumferential edge thereof to rub against the cleaning member.

12 Claims, 12 Drawing Sheets

SYSTEM FOR CLEANING A WAFER

BACKGROUND OF THE INVENTION

1. Field of the Invention

The invention relates to a system for cleaning a wafer, and more particularly to a system effectively removing particles from a circumferential edge of a wafer.

2. Description of the Related Art

Generally, after a wafer undergoes chemical mechanical polishing (CMP), the top and bottom surfaces thereof must be cleaned. Slurry and particles are thus removed from the wafer.

In a cleaning process, a wafer is transported into a cleaning chamber and held by multiple chuck rollers. The chuck rollers rotate, driving the wafer to rotate. A top cleaning brush and a bottom cleaning brush respectively rotate and move on the top and bottom surfaces of the wafer, removing the particles therefrom. Wafers, which have been cleaned by the aforementioned process, are stacked in a wafer pod and transported to a processing machine for subsequent processing.

Accordingly, particles can be removed from the top and bottom surfaces of the wafer by the aforementioned cleaning process. Nevertheless, particles on a circumferential edge of the wafer cannot be removed by the top and bottom cleaning brushes. During transportation of the wafers, the particles on the circumferential edge of the upper wafer fall onto the top surface of wafers below, causing ill effects during subsequent processing of the wafers, thus reducing yield or reliability thereof.

Hence, there is a need for a system effectively removing particles from a circumferential edge of a wafer.

BRIEF SUMMARY OF THE INVENTION

A detailed description is given in the following embodiments with reference to the accompanying drawings.

An exemplary embodiment of the invention provides a system for cleaning a wafer, comprising a first roller base, at least one first chuck roller, a second roller base, at least one second chuck roller, a sensing chuck roller, and a cleaning member. The first chuck roller is connected to the first roller base and comprises a first annular groove. The second roller base opposes the first roller base. The second chuck roller is connected to the second roller base and comprises a second annular groove. The sensing chuck roller is connected to the second roller base and comprises a third annular groove corresponding to the first and second annular grooves. The cleaning member covers the third annular groove. A circumferential edge of the wafer is positioned in the first and second annular grooves and abuts the cleaning member. The first and second chuck rollers rotate the wafer, enabling the circumferential edge thereof to rub against the cleaning member.

A central axis of the sensing chuck roller tilts to that of the second chuck roller by a predetermined angle.

The predetermined angle is between 0° and 45°.

The cleaning member comprises soft material.

The soft material comprises PVC sliver.

The system further comprises a top cleaning brush and a bottom cleaning brush. The top cleaning brush is disposed above the first and second annular grooves, brushing the top surface of the wafer. The bottom cleaning brush is disposed under the first and second annular grooves, brushing the bottom surface of the wafer.

Another exemplary embodiment of the invention provides a system for cleaning a wafer, comprising a first roller base, at least one first chuck roller, a second roller base, at least one second chuck roller, a sensing chuck roller, and a cleaning pillar. The first chuck roller is connected to the first roller base and comprises a first annular groove. The second roller base opposes the first roller base. The second chuck roller is connected to the second roller base and comprises a second annular groove. The sensing chuck roller is connected to the second roller base and comprises a third annular groove corresponding to the first and second annular grooves. The cleaning pillar is connected to the second roller base and comprises a cleaning member corresponding to the first, second, and third annular grooves. A circumferential edge of the wafer is positioned in the first, second, and third annular grooves and abuts the cleaning member. The first and second chuck rollers rotate the wafer, enabling the circumferential edge thereof to rub against the cleaning member.

A central axis of the cleaning pillar tilts to that of the second chuck roller and that of the sensing chuck roller by a predetermined angle.

Yet another exemplary embodiment of the invention provides a system for cleaning a wafer, comprising a first roller base, at least one first chuck roller, a second roller base, at least one second chuck roller, a third chuck roller, and a cleaning member. The first chuck roller is connected to the first roller base and comprises a first annular groove. The second roller base opposes the first roller base. The second chuck roller is connected to the second roller base and comprises a second annular groove. The rotational speed of the second chuck roller is the same as that of the first chuck roller. The third chuck roller is connected to the second roller base and comprises a third annular groove corresponding to the first and second annular grooves. The rotational speed of the third chuck roller differs from that of the first and second chuck rollers. The cleaning member covers the third annular groove. A circumferential edge of the wafer is positioned in the first and second annular grooves and abuts the cleaning member. The first and second chuck rollers rotate the wafer, enabling the circumferential edge thereof to rub against the cleaning member.

The rotational speed of the third chuck roller exceeds that of the first and second chuck rollers.

The system further comprises a driving motor and a transmission box. The transmission box is connected to the second roller base and comprises a first pulley, at least one second pulley, and at least one transmission belt. The driving motor is connected to the first pulley, rotating the first pulley. The first pulley is connected to the third chuck roller. The second pulley is connected to the second chuck roller. The transmission belt is connected between the first and second pulleys. The diameter of the first pulley is less than that of the second pulley.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

First Embodiment

Figure 1A:
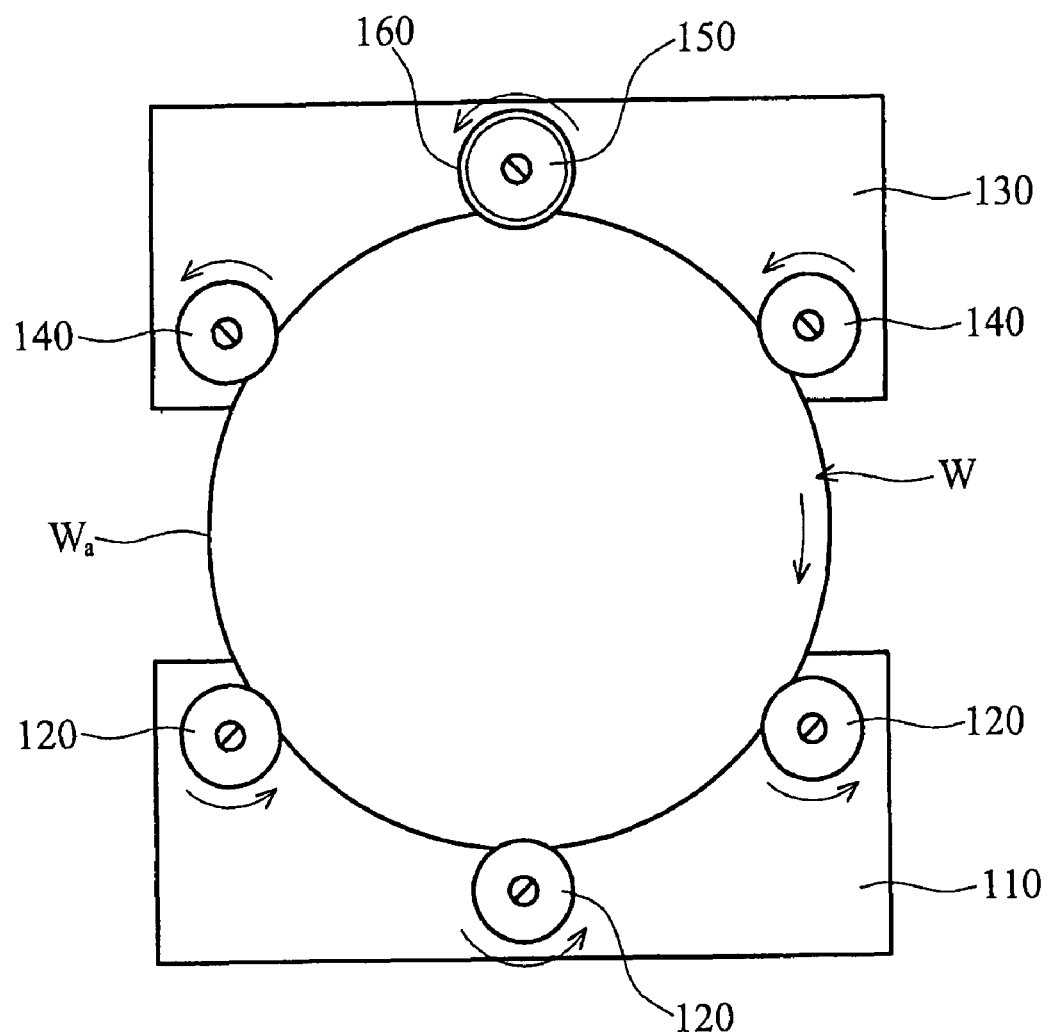
FIG. 1A is a partial top view of a system of a first embodiment of the invention.
Figure 1B:
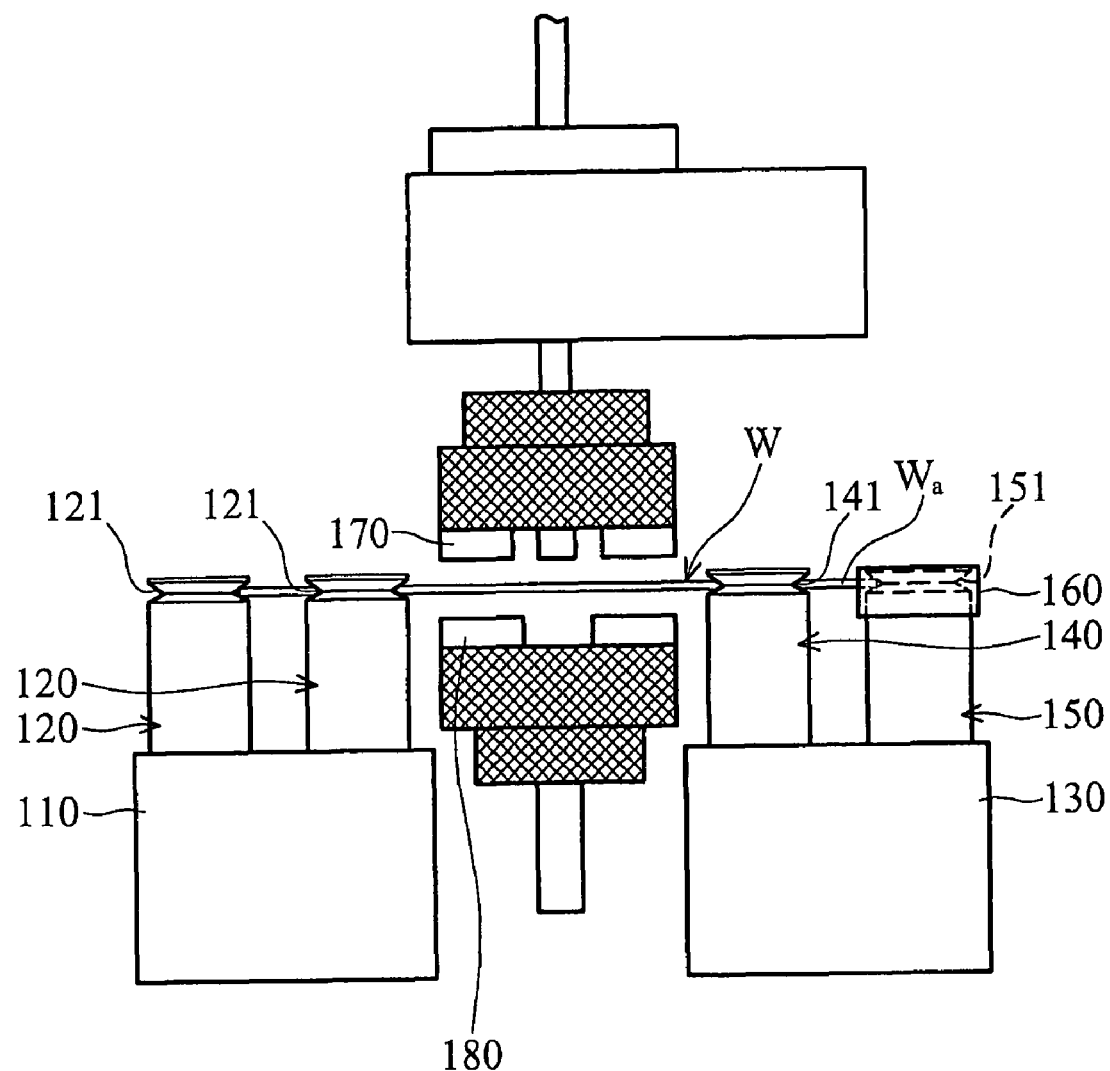
FIG. 1B is a schematic side view of the system of the first embodiment of the invention.

Referring to FIG. 1A and FIG. 1B, a system 100 for cleaning a wafer comprises a first roller base 110, multiple first chuck rollers 120, a second roller base 130, multiple second chuck rollers 140, a sensing chuck roller 150, a cleaning member 160, a top cleaning brush 170, and a bottom cleaning brush 180.

The first chuck rollers 120 are connected to the first roller base 110. Each first chuck roller 120 comprises a first annular groove 121.

The second roller base 130 opposes the first roller base 110.

The second chuck rollers 140 are connected to the second roller base 130. Each second chuck roller 140 comprises a second annular groove 141.

The sensing chuck roller 150 is connected to the second roller base 130 and comprises a third annular groove 151 corresponding to the first annular grooves 121 and second annular grooves 141.

The cleaning member 160 covers the third annular groove 151 of the sensing chuck roller 150. Here, the cleaning member 160 may comprise soft material, such as PVC sliver.

The top cleaning brush 170 is disposed above the first annular grooves 121 and second annular grooves 141, while the bottom cleaning brush 180 is disposed thereunder.

The following description is directed to operation of the system 100 for cleaning a wafer W.

A circumferential edge $W_a$ of the wafer W is positioned in the first annular grooves 121 of the first chuck rollers 120 and second annular grooves 141 of the second chuck rollers 140 and abuts the cleaning member 160 on the third annular groove 151 of the sensing chuck roller 150. The first chuck rollers 120 and second chuck rollers 140 rotate, driving the wafer W to rotate. Here, the sensing chuck roller 150 does not rotate actively and is used to detect rotation of the wafer W. Specifically, as shown in FIG. 1A, when the first chuck rollers 120 and second chuck rollers 140 rotate counterclockwise, the wafer W rotates clockwise by driving thereof. The wafer W then drives the sensing chuck roller 150 to rotate and the circumferential edge $W_a$ thereof rubs against the cleaning member 160 covering the third annular groove 151 of the sensing chuck roller 150. Thus, particles are removed from the circumferential edge $W_a$ of the wafer W by friction provided by the cleaning member 160. Moreover, the top cleaning brush 170 and bottom cleaning brush 180 respectively rotate and move on the top and bottom surfaces of the wafer W, removing particles therefrom.

Accordingly, as the particles are effectively removed from the circumferential edge $W_a$ of the wafer W by the cleaning member 160, no additional particle is generated during transportation of multiple wafers W, thus enhancing yield or reliability thereof.

Second Embodiment

Elements corresponding to those in the first embodiment share the same reference numerals.

Figure 2A:
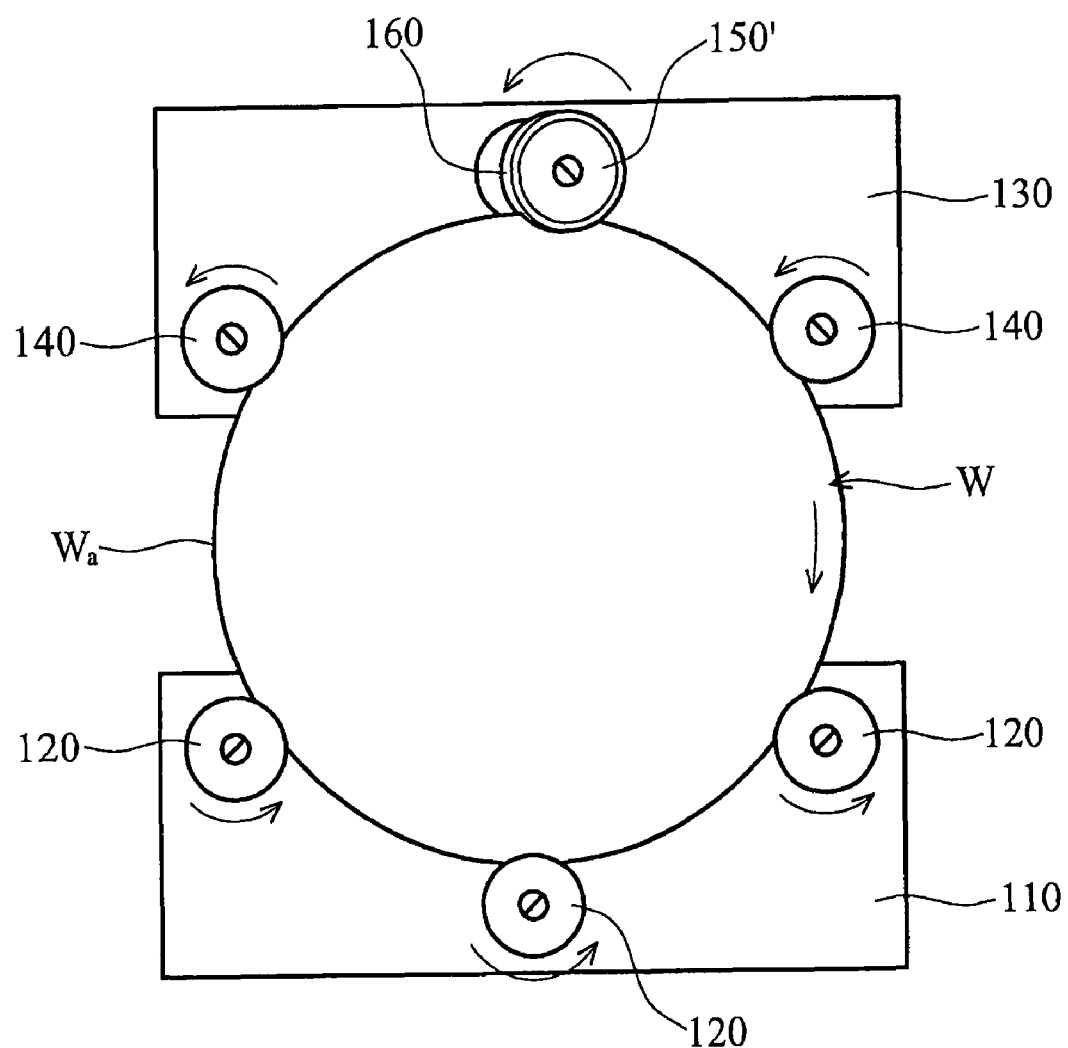
FIG. 2A is a partial top view of a system of a second embodiment of the invention.
Figure 2B:
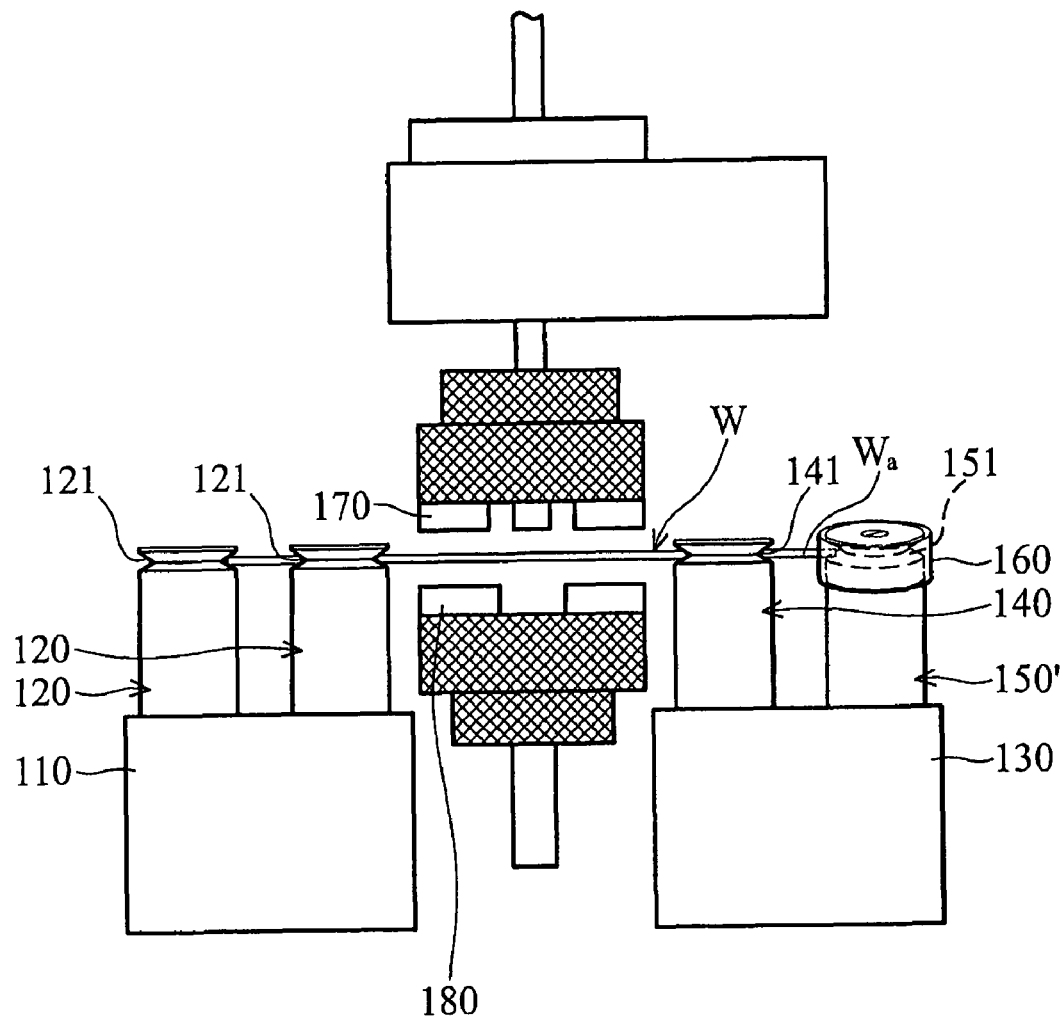
FIG. 2B is a schematic side view of the system of the second embodiment of the invention.
Figure 2C:
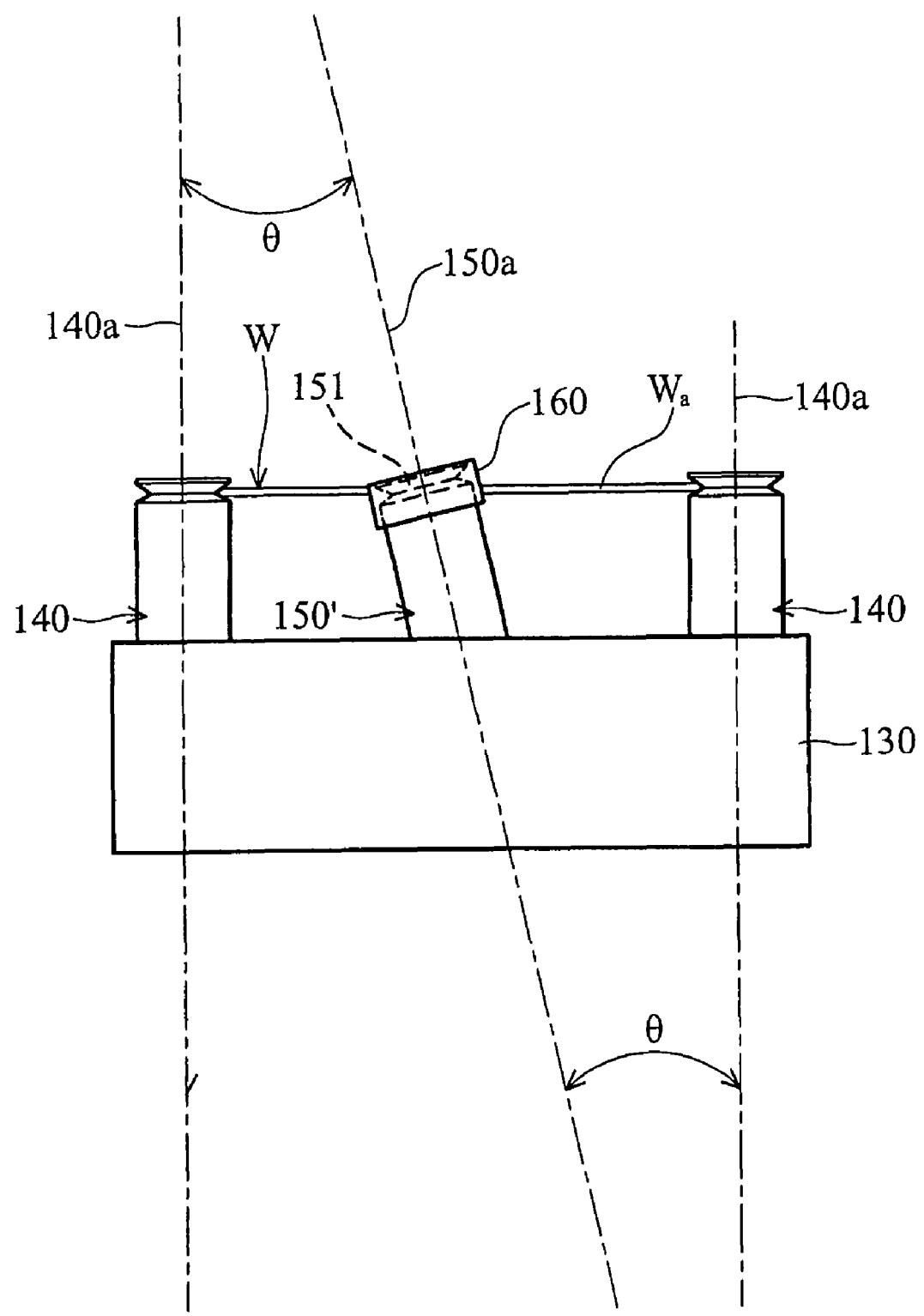
FIG. 2C is a top view of FIG. 2A.

Referring to FIGS. 2A, 2B, and 2C, in a system 100', a sensing chuck roller 150' tilts to the second roller base 130. Specifically, as shown in FIG. 2C, a central axis 150a of the sensing chuck roller 150' tilts to a central axis 140a of the second chuck rollers 140 by a predetermined angle θ. Here, the predetermined angle θ may be between 0° and 45°.

Structure, disposition, and function of other elements in this embodiment are the same as those in the first embodiment, and explanation thereof is omitted for simplicity.

Accordingly, when the circumferential edge $W_a$ of the wafer W rubs against the cleaning member 160 covering the third annular groove 151 of the sensing chuck roller 150', particles are removed from the circumferential edge $W_a$ by friction provided by the cleaning member 160. Here, the friction provided by the cleaning member 160 can be decomposed into a downward componential friction. The downward componential friction effectively contributes to downward removal of the particles from the circumferential edge $W_a$ of the wafer W.

Third Embodiment

Elements corresponding to those in the first embodiment share the same reference numerals.

Figure 3A:
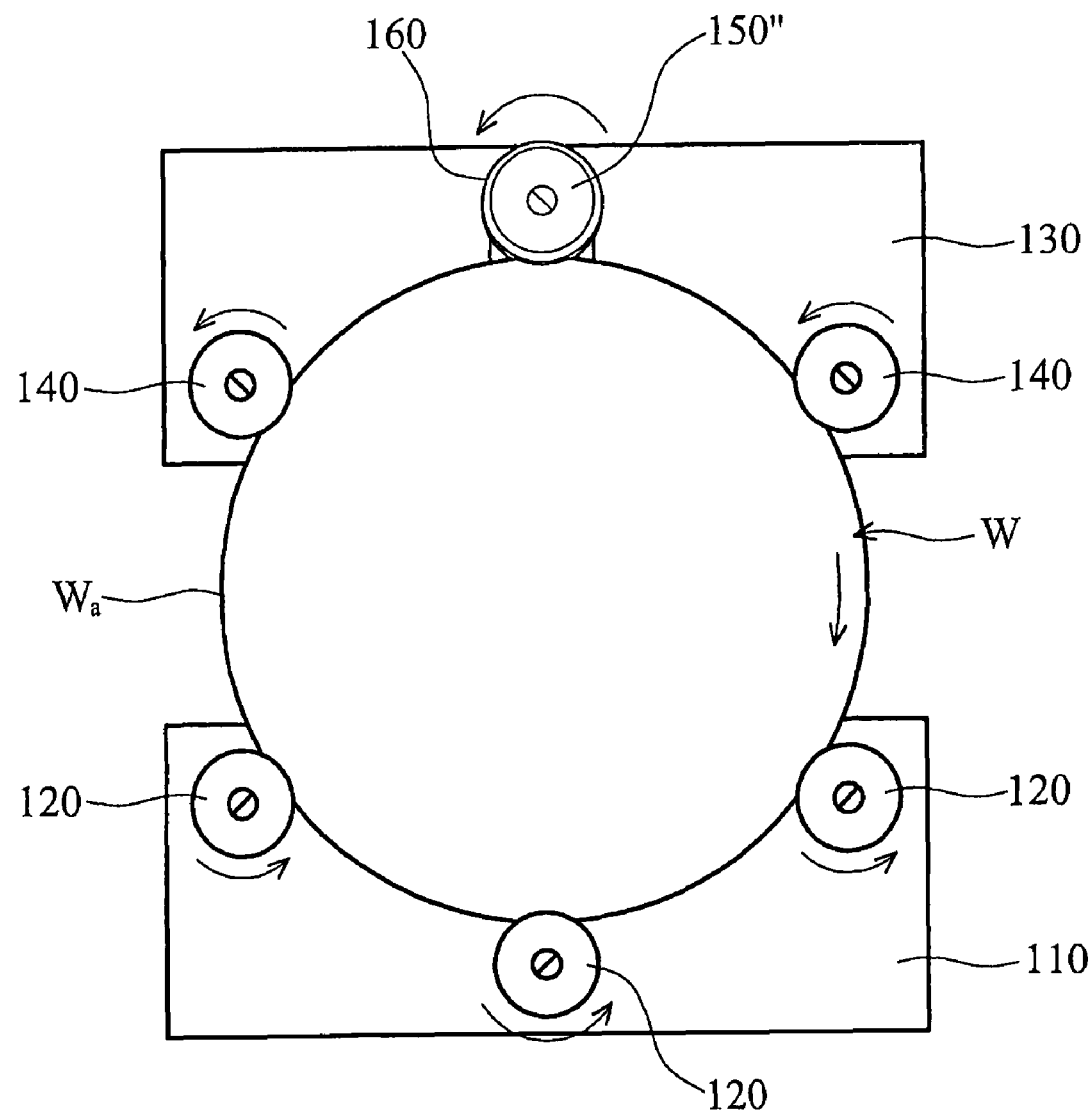
FIG. 3A is a partial top view of a system of a third embodiment of the invention.
Figure 3B:
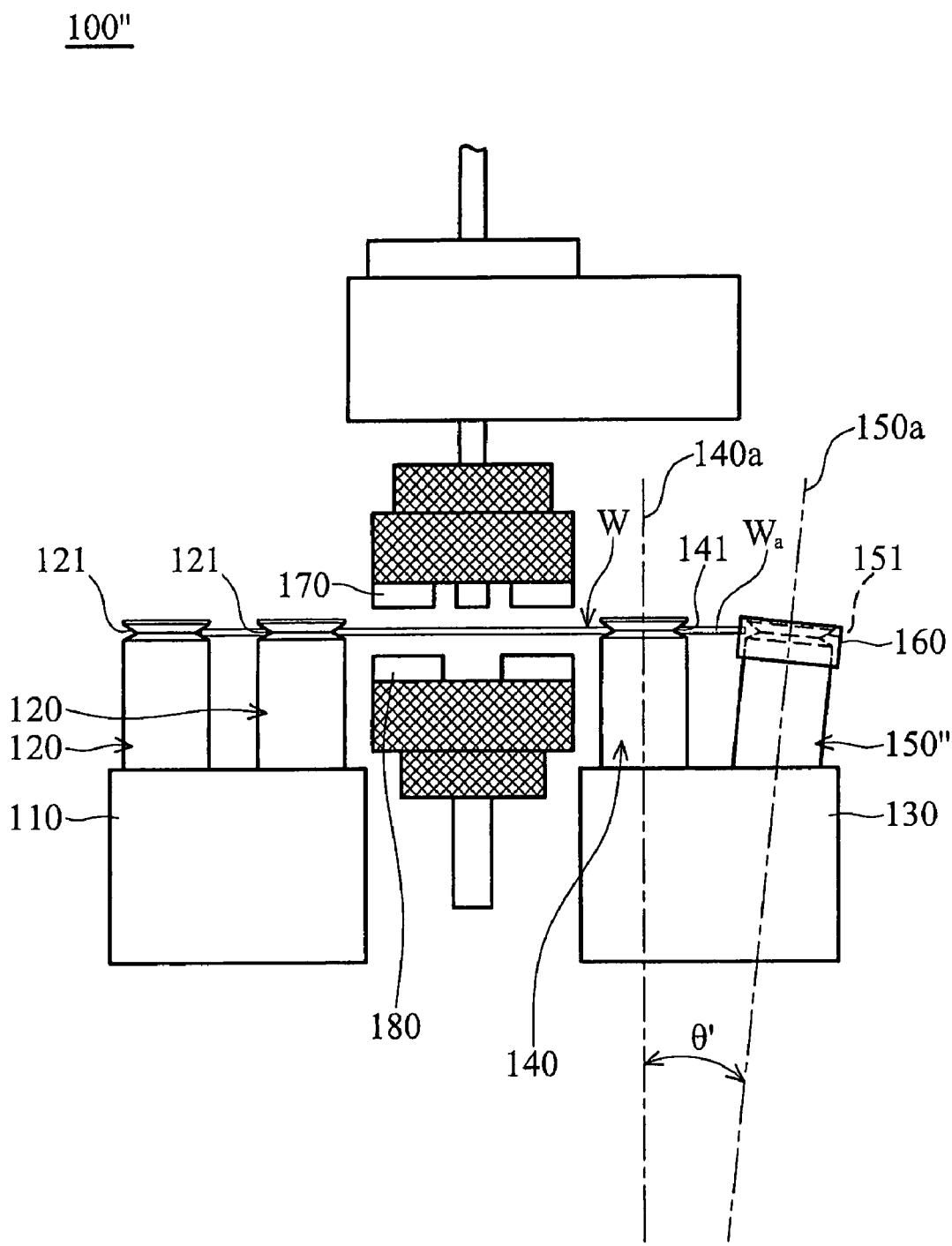
FIG. 3B is a schematic side view of the system of the third embodiment of the invention.

Referring to FIG. 3A and FIG. 3B, in a system 100", a sensing chuck roller 150" tilts to the second roller base 130. Specifically, as shown in FIG. 3B, a central axis 150a of the sensing chuck roller 150" tilts to a central axis 140a of the second chuck rollers 140 by a predetermined angle θ'. Here, the predetermined angle θ' may be between 0° and 45°.

Structure, disposition, and function of other elements in this embodiment are the same as those in the first embodiment, and explanation thereof is omitted for simplicity.

Accordingly, when the circumferential edge $W_a$ of the wafer W rubs against the cleaning member 160 covering the third annular groove 151 of the sensing chuck roller 150", particles are removed from the circumferential edge $W_a$ by friction provided by the cleaning member 160. Similarly, the friction provided by the cleaning member 160 can be decomposed into a downward componential friction effectively contributing to downward removal of the particles from the circumferential edge $W_a$ of the wafer W.

Fourth Embodiment

Figure 4A:
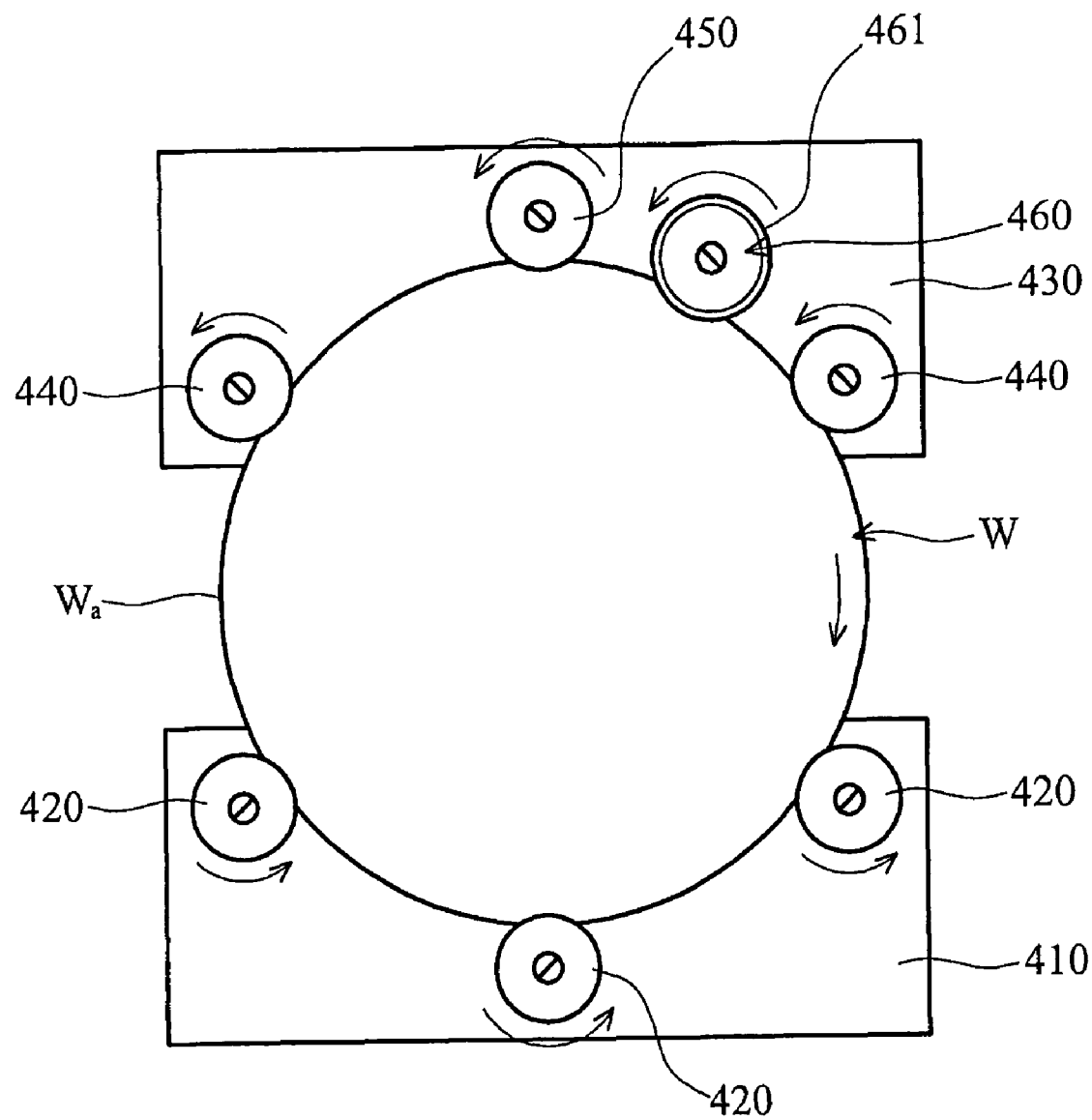
FIG. 4A is a partial top view of a system of a fourth embodiment of the invention.
Figure 4B:
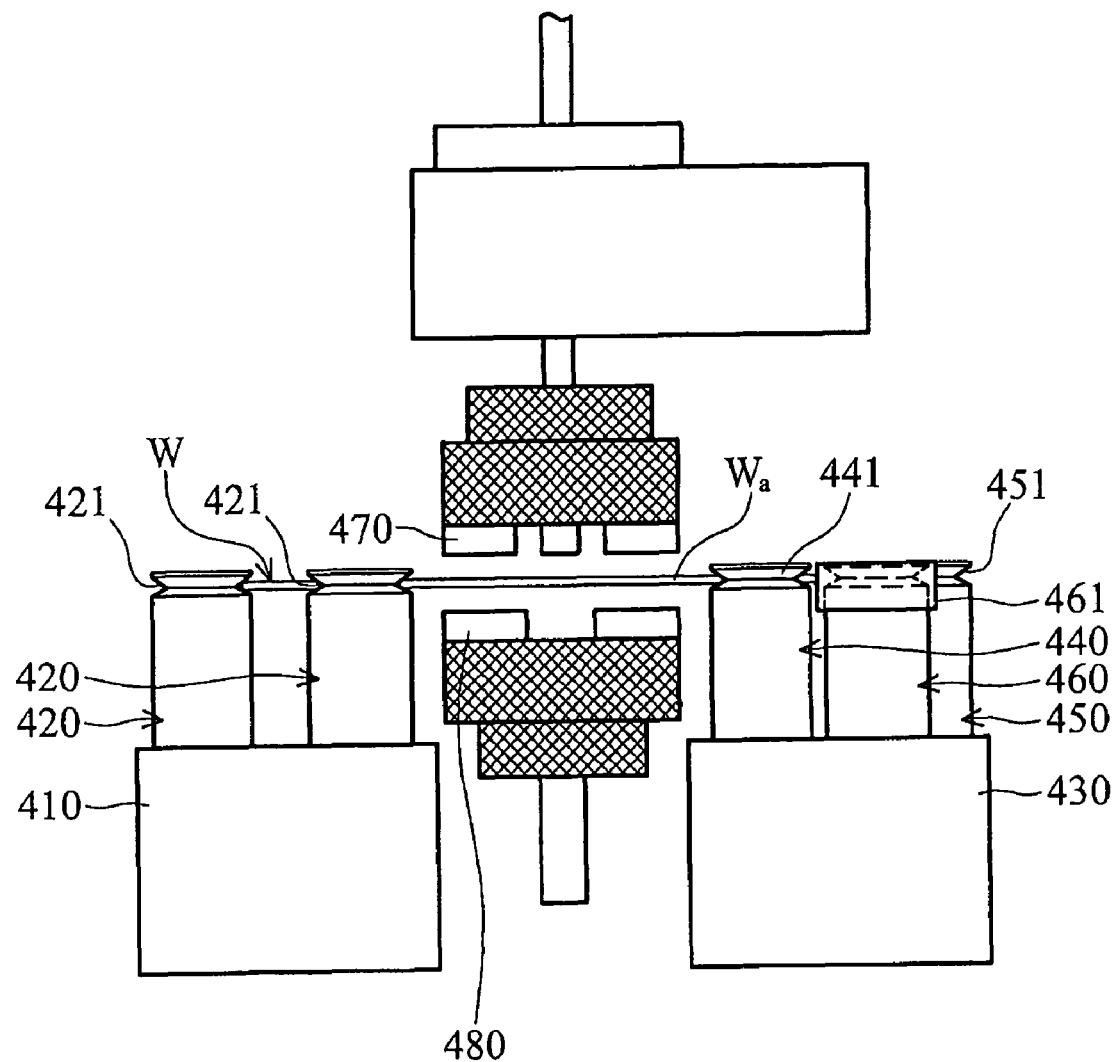
FIG. 4B is a schematic side view of the system of the fourth embodiment of the invention.

Referring to FIG. 4A and FIG. 4B, a system 400 for cleaning a wafer comprises a first roller base 410, multiple first chuck rollers 420, a second roller base 430, multiple second chuck rollers 440, a sensing chuck roller 450, a cleaning pillar 460, a top cleaning brush 470, and a bottom cleaning brush 480.

The first chuck rollers 420 are connected to the first roller base 410. Each first chuck roller 420 comprises a first annular groove 421.

The second roller base 430 opposes the first roller base 410.

The second chuck rollers 440 are connected to the second roller base 430. Each second chuck roller 440 comprises a second annular groove 441.

The sensing chuck roller 450 is connected to the second roller base 430 and comprises a third annular groove 451 corresponding to the first annular grooves 421 and second annular grooves 441.

The cleaning pillar 460 is connected to the second roller base 430 and comprises a cleaning member 461 corresponding to the first annular grooves 421, second annular grooves 441, and third annular groove 451. Here, the cleaning member 461 may comprise soft material, such as PVC sliver.

The top cleaning brush 470 is disposed above the first annular grooves 421, second annular grooves 441, and third annular groove 451, while the bottom cleaning brush 480 is disposed thereunder.

The following description is directed to operation of the system 400 for cleaning a wafer W.

A circumferential edge $W_a$ of the wafer W is positioned in the first annular grooves 421 of the first chuck rollers 420, second annular grooves 441 of the second chuck rollers 440, and third annular groove 451 of the sensing chuck roller 450 and abuts the cleaning member 461 of the cleaning pillar 460. The first chuck rollers 420 and second chuck rollers 440 rotate, driving the wafer W to rotate. Here, the sensing chuck roller 450 does not rotate actively and is used to detect rotation of the wafer W. Specifically, as shown in FIG. 4A, when the first chuck rollers 420 and second chuck rollers 440 rotate counterclockwise, the wafer W rotates clockwise by driving thereof. The wafer W then drives the sensing chuck roller 450 to rotate and the circumferential edge $W_a$ thereof rubs against the cleaning member 461 of the cleaning pillar 460. Thus, particles are removed from the circumferential edge $W_a$ of the wafer W by friction provided by the cleaning member 461. Moreover, the top cleaning brush 470 and bottom cleaning brush 480 respectively rotate and move on the top and bottom surfaces of the wafer W, removing particles therefrom.

Accordingly, as the particles are effectively removed from the circumferential edge $W_a$ of the wafer W by the cleaning member 461 of the cleaning pillar 460, no additional particle is generated during transportation of multiple wafers W, thus enhancing yield or reliability thereof.

Moreover, the cleaning pillar 460 may selectively tilt to the second roller base 430 as the sensing chuck roller 150' (or 150") tilts to the second roller base 130 in the second (or third) embodiment. Namely, a central axis (not shown) of the cleaning pillar 460 may tilt to a central axis (not shown) of the second chuck rollers 440 by a predetermined angle. Similarly, the predetermined angle may be between 0° and 45°. Accordingly, friction provided by the cleaning member 461 can be decomposed into a downward componential friction effectively contributing to downward removal of the particles from the circumferential edge $W_a$ of the wafer W.

Fifth Embodiment

Figure 5A:
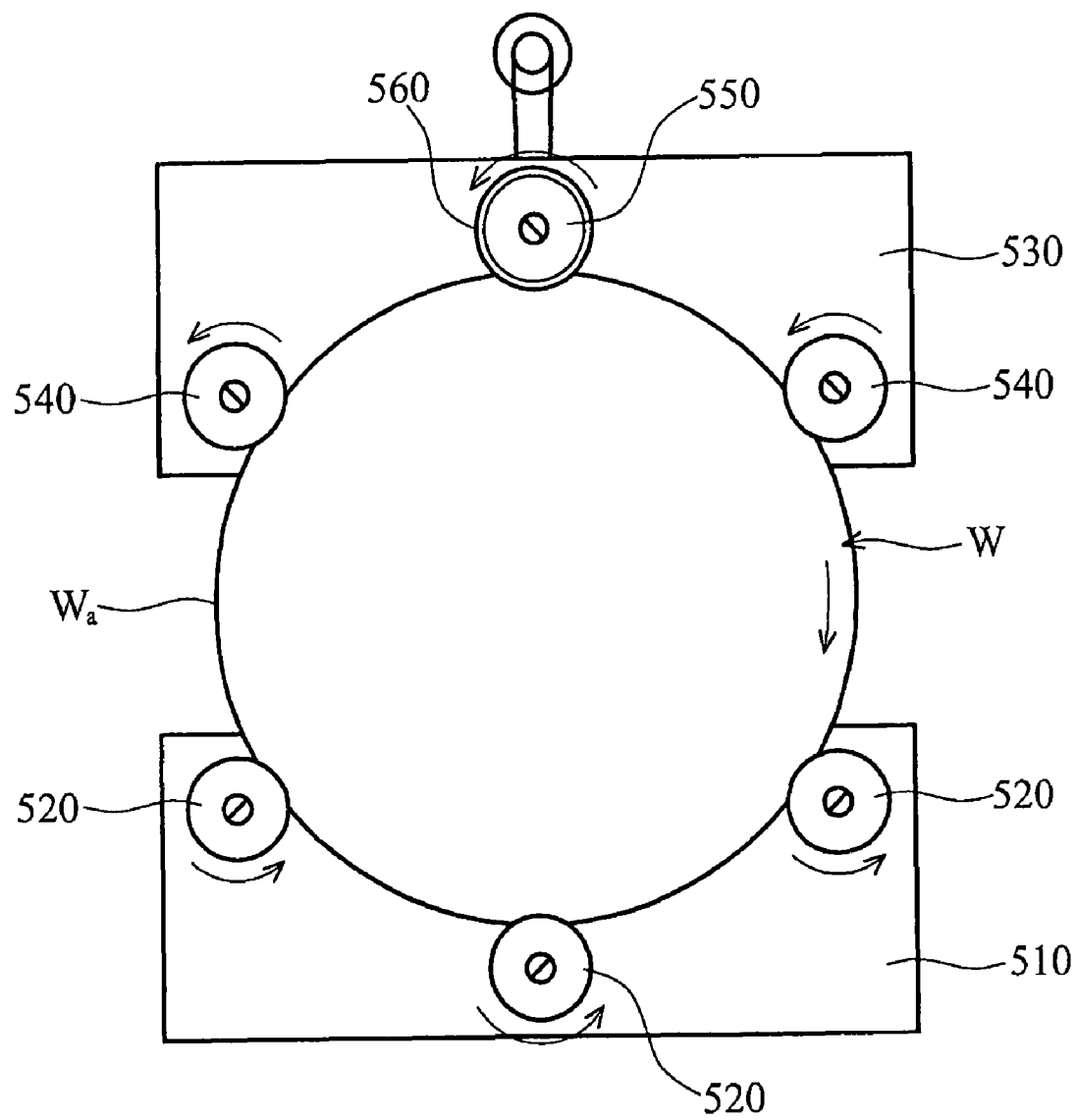
FIG. 5A is a partial top view of a system of a fifth embodiment of the invention.
Figure 5B:
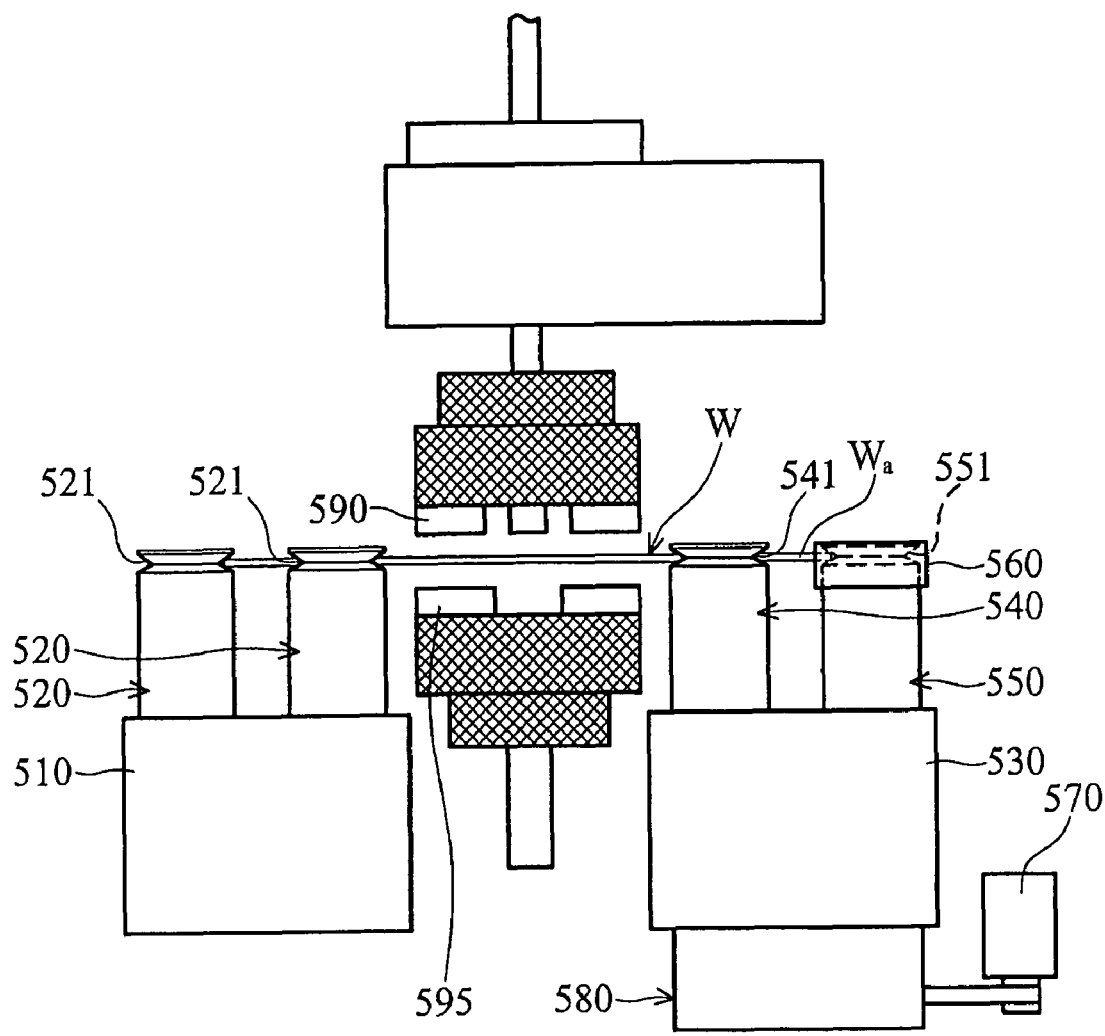
FIG. 5B is a schematic side view of the system of the fifth embodiment of the invention.

Referring to FIG. 5A and FIG. 5B, a system 500 for cleaning a wafer comprises a first roller base 510, multiple first chuck rollers 520, a second roller base 530, multiple second chuck rollers 540, a third chuck roller 550, a cleaning member 560, a driving motor 570, a transmission box 580, a top cleaning brush 590, and a bottom cleaning brush 595.

The first chuck rollers 520 are connected to the first roller base 510. Each first chuck roller 520 comprises a first annular groove 521.

The second roller base 530 opposes the first roller base 510.

The second chuck rollers 540 are connected to the second roller base 530. Each second chuck roller 540 comprises a second annular groove 541. Specifically, the rotational speed of the second chuck rollers 540 is the same as that of the first chuck rollers 520.

The third chuck roller 550 is connected to the second roller base 530 and comprises a third annular groove 551 corresponding to the first annular grooves 521 and second annular groove 541. Specifically, the rotational speed of the third chuck roller 550 differs from that of the first chuck rollers 520 and second chuck rollers 540.

Figure 5C:
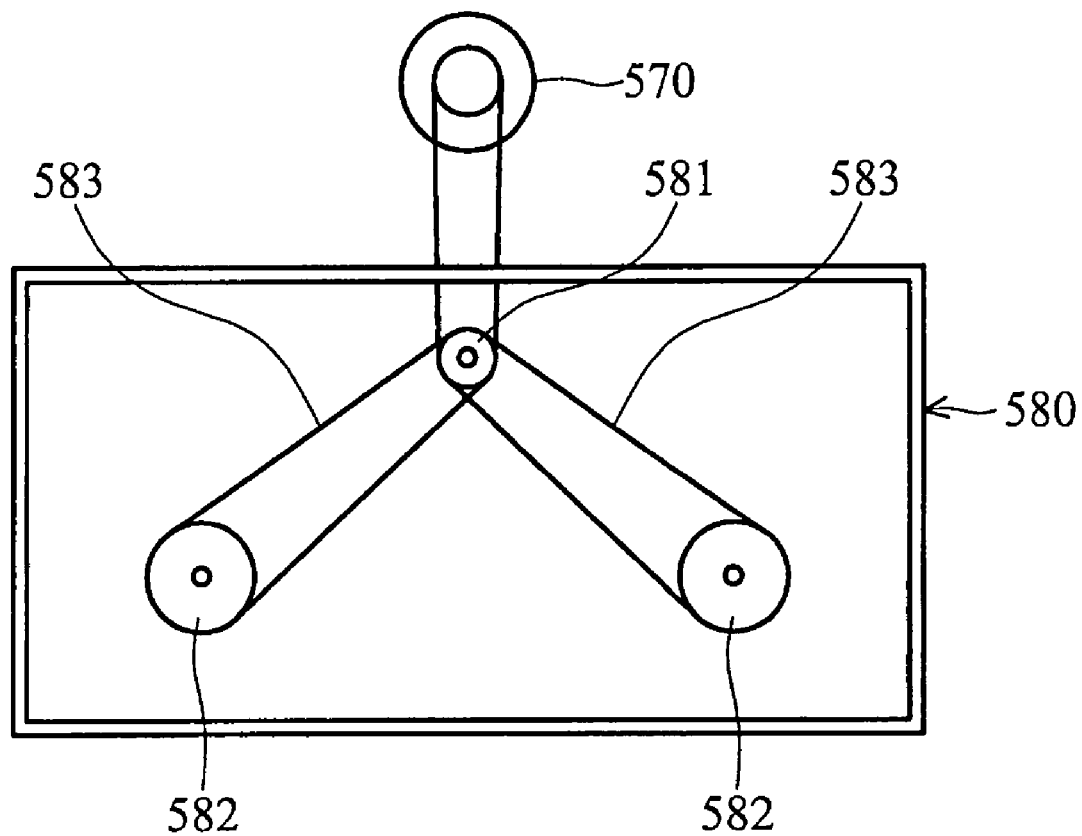
FIG. 5C is a schematic plan view showing structure of a driving motor and a transmission box of the system of the fifth embodiment of the invention.

As shown in FIG. 5B and FIG. 5C, the transmission box 580 is connected to the second roller base 530 and comprises a first pulley 581, multiple second pulleys 582, and multiple transmission belts 583. The driving motor 570 is connected to the first pulley 581, rotating the same. The first pulley 581 is connected to the third chuck roller 550. Each second pulley 582 is connected to each second chuck roller 540. Each transmission belt 583 is connected between the first pulley 581 and each second pulley 582. Specifically, the diameter of the first pulley 581 differs from that of the second pulleys 582. Accordingly, when the driving motor 570 drives the first pulley 581 to rotate, the rotational speed of the third chuck roller 550 connected to the first pulley 581 differs from that of the second chuck rollers 540 connected to the second pulleys 582.

In this embodiment, the diameter of the first pulley 581 is less than that of the second pulleys 582, such that the rotational speed of the first pulley 581 exceeds that of the second pulleys 582. The rotational speed of the third chuck roller 550 thus exceeds that of the second chuck rollers 540.

The cleaning member 560 covers the third annular groove 551 of the third chuck roller 550. Here, the cleaning member 560 may comprise soft material, such as PVC sliver.

The top cleaning brush 590 is disposed above the first annular grooves 521, second annular grooves 541, and third annular groove 551, while the bottom cleaning brush 595 is disposed thereunder.

The following description is directed to operation of the system 500 for cleaning a wafer W.

A circumferential edge $W_a$ of the wafer W is positioned in the first annular grooves 521 of the first chuck rollers 520 and second annular grooves 541 of the second chuck rollers 540 and abuts the cleaning member 560 on the third annular groove 551 of the third chuck roller 550. The first chuck rollers 520 and second chuck rollers 540 rotate, driving the wafer W to rotate. Specifically, as shown in FIG. 5A, when the first chuck rollers 520 and second chuck rollers 540 rotate counterclockwise, the wafer W rotates clockwise by driving thereof. Here, the circumferential edge $W_a$ of the wafer W is in rolling contact with the first chuck rollers 520 and second chuck rollers 540. Specifically, as the rotational speed of the third chuck roller 550 exceeds that of the first chuck rollers 520 and second chuck rollers 540, the circumferential edge $W_a$ of the wafer W is in sliding contact with the cleaning member 560 covering the third annular groove 551 of the third chuck roller 550. Thus, particles are removed from the circumferential edge $W_a$ of the wafer W by friction provided by the cleaning member 560. Moreover, the top cleaning brush 590 and bottom cleaning brush 595 respectively rotate and move on the top and bottom surfaces of the wafer W, removing particles therefrom.

Accordingly, as the particles are effectively removed from the circumferential edge $W_a$ of the wafer W by the cleaning member 560, no additional particle is generated during transportation of multiple wafers W, thus enhancing yield or reliability thereof.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A system for cleaning a wafer, comprising:
a first roller base;
at least one first chuck roller connected to the first roller base and comprising a first annular groove;
a second roller base opposing the first roller base;
at least one second chuck roller connected to the second roller base and comprising a second annular groove;
a sensing chuck roller connected to the second roller base and comprising a third annular groove corresponding to the first and second annular grooves; and
a cleaning member disposed on the second roller base, wherein a circumferential edge of the wafer is positioned in the first and second annular grooves and abuts the cleaning member, and the first and second chuck rollers rotate the wafer, enabling the circumferential edge thereof to rub against the cleaning member,
wherein the cleaning member covers the third annular groove and a central axis of the sensing chuck roller tilts to that of the second chuck roller by a predetermined angle.

2. The system as claimed in claim 1, wherein the predetermined angle is between 0° and 45°.

3. The system as claimed in claim 1, wherein the cleaning member comprises soft material.

4. The system as claimed in claim 3, wherein the soft material comprises PVC sliver.

5. The system as claimed in claim 1, further comprising a top cleaning brush and a bottom cleaning brush, wherein the top cleaning brush is disposed above the first and second annular grooves, brushing the top surface of the wafer, and the bottom cleaning brush is disposed under the first and second annular grooves, brushing the bottom surface of the wafer.

6. The system as claimed in claim 1, wherein the rotational speed of the second chuck roller is the same as that of the first chuck roller, and the rotational speed of the sensing chuck roller differs from that of the first and second chuck rollers.

7. The system as claimed in claim 6, wherein the cleaning member comprises soft material.

8. The system as claimed in claim 7, wherein the soft material comprises PVC sliver.

9. The system as claimed in claim 6, wherein the rotational speed of the sensing chuck roller exceeds that of the first and second chuck rollers.

10. The system as claimed in claim 9, further comprising a driving motor and a transmission box, wherein the transmission box is connected to the second roller base and comprises a first pulley, at least one second pulley, and at least one transmission belt, the driving motor is connected to the first pulley, rotating the first pulley, the first pulley is connected to the sensing chuck roller, the second pulley is connected to the second chuck roller, the transmission belt is connected between the first and second pulleys, and the diameter of the first pulley is less than that of the second pulley.

11. The system as claimed in claim 6, further comprising a driving motor and a transmission box, wherein the transmission box is connected to the second roller base and comprises a first pulley, at least one second pulley, and at least one transmission belt, the driving motor is connected to the first pulley, rotating the first pulley, the first pulley is connected to the sensing chuck roller, the second pulley is connected to the second chuck roller, the transmission belt is connected between the first and second pulleys, and the diameter of the first pulley differs from that of the second pulley.

12. The system as claimed in claim 6, further comprising a top cleaning brush and a bottom cleaning brush, wherein the top cleaning brush is disposed above the first, second, and third annular grooves, brushing the top surface of the wafer, and the bottom cleaning brush is disposed under the first, second, and third annular grooves, brushing the bottom surface of the wafer.

* * * * *